United States Patent [19]
Bearinger et al.

[11] Patent Number: 5,611,884
[45] Date of Patent: Mar. 18, 1997

[54] FLIP CHIP SILICONE PRESSURE SENSITIVE CONDUCTIVE ADHESIVE

[75] Inventors: Clayton R. Bearinger; Robert C. Camilletti, both of Midland, Mich.; Jack S. Kilby, Dallas, Tex.; Loren A. Haluska; Keith W. Michael, both of Midland, Mich.

[73] Assignee: Dow Corning Corporation, Midland, Mich.

[21] Appl. No.: 570,030

[22] Filed: Dec. 11, 1995

[51] Int. Cl.⁶ .......................................... C09J 4/00
[52] U.S. Cl. .......... 156/325; 156/329; 156/379.8; 257/778; 428/447; 428/356; 437/209; 437/212
[58] Field of Search .................. 156/325, 329, 156/379.8, 297, 230; 437/209, 212; 257/737, 746, 778; 428/403, 344, 355, 447, 356

[56] References Cited

U.S. PATENT DOCUMENTS

| | | | |
|---|---|---|---|
| 4,016,328 | 4/1977 | Horning | 428/447 |
| 4,716,081 | 12/1987 | Ehrreich | 428/403 |
| 4,811,081 | 3/1989 | Lyden | 257/746 |
| 5,248,739 | 9/1993 | Schmidt | 525/477 |
| 5,443,876 | 8/1995 | Koskenmaki | 428/40 |
| 5,510,174 | 4/1996 | Litman | 428/344 |
| 5,543,585 | 8/1996 | Booth | 361/770 |
| 5,550,408 | 8/1996 | Kunitomo | 257/737 |

*Primary Examiner*—Patrick Ryan
*Assistant Examiner*—Patrick R. Jewik
*Attorney, Agent, or Firm*—James L. DeCesare

[57] ABSTRACT

A method and composition for joining flip chips back-side-up with respect to substrates by applying an adhesive between the active side of the flip chip and the substrate. The adhesive is a conductive silicone pressure sensitive adhesive containing (i) a silicone resin, (ii) a siloxane gum, (iii) a conductive particulate material, and optionally, (iv) a peroxide catalyst. Suitable conductive particulate materials are silver-clad glass fibers; spherical gold particles; spherical hollow glass microspheres coated with silver, gold, nickel, or copper; or spherical particles of metal alloys of Sn/Cu, Pb/Sn, or Au/Sn. The adhesive can be applied as a ball or bump itself, in conjunction with a solder ball or bump, or in the form of tape sandwiched between the flip chip and substrate.

8 Claims, 2 Drawing Sheets

INSERT MODE  MATE MODE  REMOVAL MODE

FLIP CHIP SILICONE PRESSURE SENSITIVE CONDUCTIVE ADHESIVE

BACKGROUND OF THE INVENTION

This invention is directed to integrated circuits, and to improvements in the interconnections used therein.

Most modern electronic systems include one or more integrated circuit (IC) chips bonded to a suitable ceramic substrate, which in turn is connected to an electronic package such as a module, card, board, or gate.

In many of these electronic systems, solder bump interconnections are used in order to eliminate the expense, unreliability, and low productivity, of wirebonding of chips to their substrate. Thus, the so-called Controlled Collapse Chip Connection (C4), for example, utilizes solder bumps deposited on solder wettable metal terminals on the IC chip, and matching footprints of solder wettable terminals on the substrate.

This upside-down chip or flip chip is aligned to the substrate, and all of the joints are made simultaneously by reflowing the solder. Flip chip joining is opposite to traditional back-side-down methods of bonding, in which the active side of the chip, i.e. facing up, is wirebonded. In the flip chip, the back of the chip is free of mechanically or electrically delicate surface features.

While the flip chip interconnection method has been largely successful in various applications, it suffers from certain disadvantages, among which are that it is susceptible to mismatches between the coefficients of thermal expansion of the chip and the substrate. Thus, mismatches between these materials results in high shear stresses in the solder joints, which compromises the reliability of the flip chip interconnection.

What we propose as a solution is a new conductive adhesive containing randomly dispersed populations of conductive particles. The particles can be distributed so as to provide electrical conductivity through only the thickness of the adhesive, or the particles can be distributed so as to provide electrical conductivity through the bulk of the adhesive in all directions. Our adhesive possesses the advantages of being repairable, reworkable, and it can be entirely removed from a bonded device with heat and/or solvent. These features allow for devices to be temporarily positioned, tested, removed, and repositioned permanently, without damage to the device. During the process, if one or more of the chips are found to be defective, it can be removed and replaced with ease.

BRIEF SUMMARY OF THE INVENTION

In a first embodiment, our invention relates to a tacky conductive adhesive that can be repeatedly utilized to test the integrated circuit of any die (chip) prior to its further processing. The tacky conductive adhesive material can also be used as a die (chip) attachment adhesive. The formulation of the tacky conductive adhesive includes a silicone resin, a silicone gum, a conductive particulate material such as silver-clad glass fibers, and may include a peroxide catalyst. According to this first embodiment, the conductive adhesive material must have a tacky character to work in electronic applications, as the tackiness ensures that intimate contact is made with the circuit, so that it can be adequately tested.

In a second embodiment, our invention relates to a tacky conductive adhesive that can be utilized for flip chip production processes. The tacky conductive adhesive is prepared by combining a silicone resin, a silicone gum, a conductive particulate material such as silver-clad glass hollow microspheres, and a peroxide catalyst.

Our second embodiment represents an economical solution in the manufacture of flip chip devices. It is suitable as a conductive adhesive for solderless flip chip applications, although it can be used in conjunction with solder flip chip applications. This approach provides a simple method for securing a flip chip to the interconnects on a substrate without using solder materials, which typically lack the elasticity and toughness to afford good reliability. The conductive adhesive can be applied to each bond pad on the flip chip and cured to provide a tacky surface.

In our second embodiment, we use a simple mixture of a tacky adhesive formulation, together with conductive spherical particles. We have found that any of three types of conductive particulate materials are suitable and can be used.

A first representative type of conductive particulate material are spherical gold particle's having an average diameter of about 3–5 micrometers (microns).

A second representative type of conductive particulate material, and the type most preferred according to our invention, are spherical hollow glass microspheres coated with silver, gold, nickel, or copper. One particularly useful particulate of this second type is silver-coated glass microspheres having an average particle diameter ranging from about 3 to about 5 micrometers (microns).

A third representative type of conductive particulate material are spherical particles of metal alloys. Some specific examples of this third type are 39Sn/10Cu with an average diameter of about 10 mils (254 micrometers), 49Pb/5Sn with an average diameter of about 16 mils (406 micrometers), 49Pb/10Sn with an average diameter of about 3 mils (76 micrometers), and 49Au/20Sn with an average diameter of about 3 mils. All three types of the foregoing conductive spherical particles are commercial products and readily available in the marketplace.

To illustrate the manner in which the conductive adhesive in our second embodiment functions, the conductive spherical particles are first disposed in the matrix of the adhesive. The particles do not touch each other, so that they are not conductive within the matrix itself. However, when the mixture of the conductive spherical particles and the adhesive are placed on a bond pad of a flip chip, and then the flip chip with its bond pads is coated with the mixture, pressed together with the substrate interconnect, electrical contact is attained between the bond pad and the interconnect.

If desired, the conductive adhesive can be conductive in its bulk in all directions by altering the disposition of conductive particles in the adhesive matrix, i.e. the particles touch each other, so that they are conductive within the matrix itself.

These and other features and objects of the invention will become apparent from a consideration of the detailed description.

DETAILED DESCRIPTION

Figures 1A, 1B:
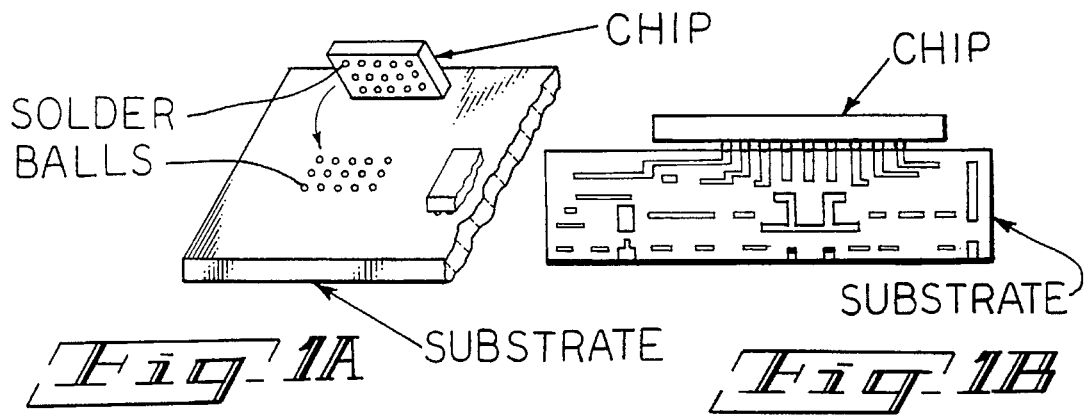
FIG. 1A and 1B is a simplified functional representation of a conventional Controlled Collapse Chip Connection (C4) to which the present invention is an improvement.

With reference to the drawings, FIGS. 1A and 1B depict one typical arrangement of a conventional Controlled Collapse Chip Connection (C4) to which our invention can pertain. Thus, a flip chip is connected to a substrate using solder balls, as is known in the art. The interior of the substrate shown in FIG. 1B includes the various layers of electrical inputs and outputs used for signal and power distribution or redistribution.

Figure 2:
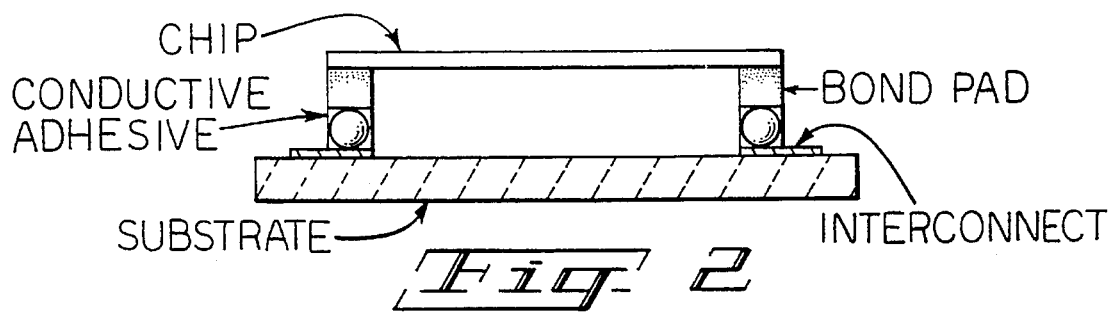
FIG. 2 is a simplified functional representation of one embodiment of our Controlled Collapse Chip Connection, including the chip and substrate of FIGS. 1A and 1B, but showing our new conductive adhesive, which can be used in place of the solder balls in FIG. 1A.

In FIG. 2, we show one of our embodiments in which we have taken the chip and substrate of FIG. 1A and 1B, rand substituted our new conductive adhesive for the solder balls shown in FIG. 1A.

Figures 3A, 3B, 3C:
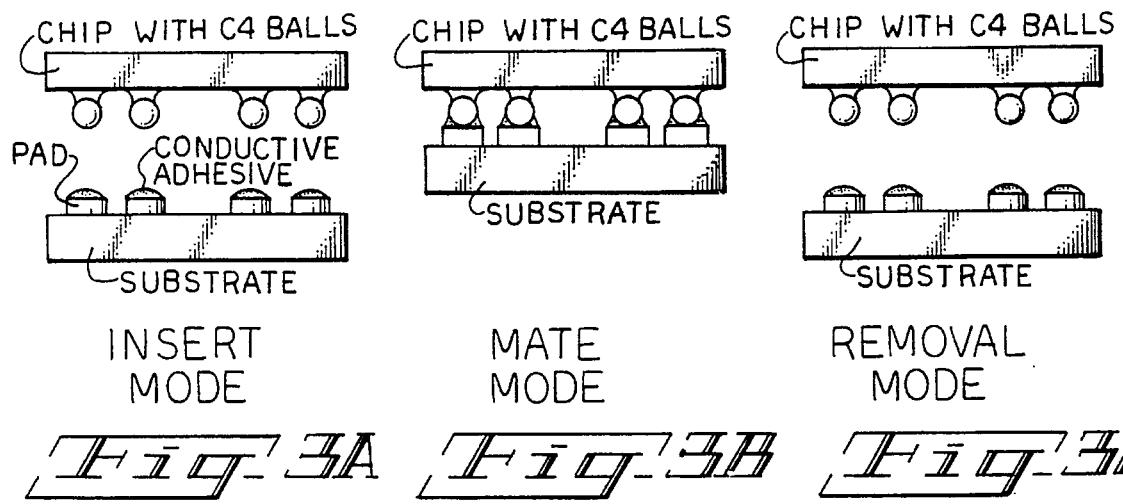
FIGS. 3(a), 3(b), and 3(c), are simplified functional representations of another embodiment of our Controlled Collapse Chip Connection, similar to FIG. 2, but including a pad on the substrate for holding our new conductive adhesive. In this embodiment, the conductive adhesive is used in conjunction with the solder balls. These three Figures show the modes of assembly and disassembly, i.e. insert mode 3(a), mate mode 3(b), and removal mode 3(c).

FIGS. 3(a)–3(c) represent another of our embodiments in which our new conductive adhesive is used in conjunction with the solder balls in FIG. 1A. These figures show how a pad is provided on the substrate for holding our new conductive adhesive during its use in the assembly and disassembly modes, i.e. insert mode 3(a), mate mode 3(b), and removal mode 3(c).

Figure 4:
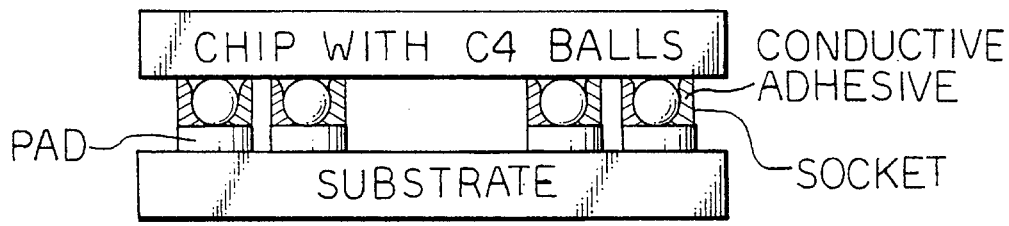
FIG. 4 is a simplified functional representation of yet another embodiment of our Controlled Collapse Chip Connection, similar to FIG. 3(b), but including a socket on the substrate for holding our new conductive adhesive. The socket functions to retain the adhesive.

FIG. 4 depicts a similar arrangement, but includes the perfecting feature of a socket on the substrate pad for holding our new conductive adhesive to retain the adhesive.

Figure 5A:
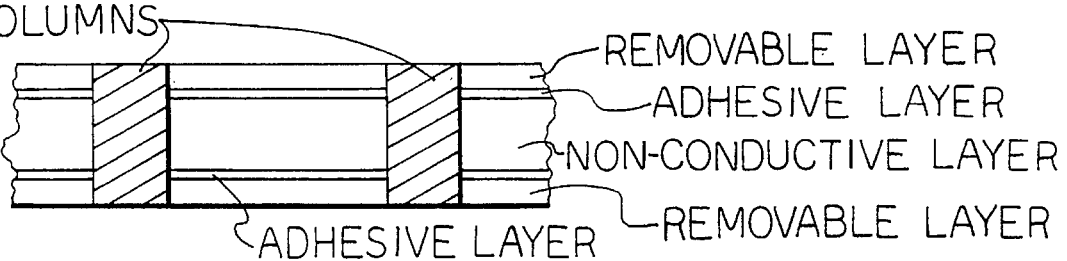
FIGS. 5(a), 5(b), and 5(c), are simplified functional representations of still another embodiment of our Controlled Collapse Chip Connection, similar to FIGS. 3(a), 3(b), and 3(c), but including an adhesive tape containing conductive adhesive columns instead of solder balls. The three Figures show the mode of assembly, i.e. the tape itself in FIG. 5(a), the tape adhered to the chip in FIG. 5(b), and the tape sandwiched between the chip and the substrate in FIG. 5(c).
Figure 5B:
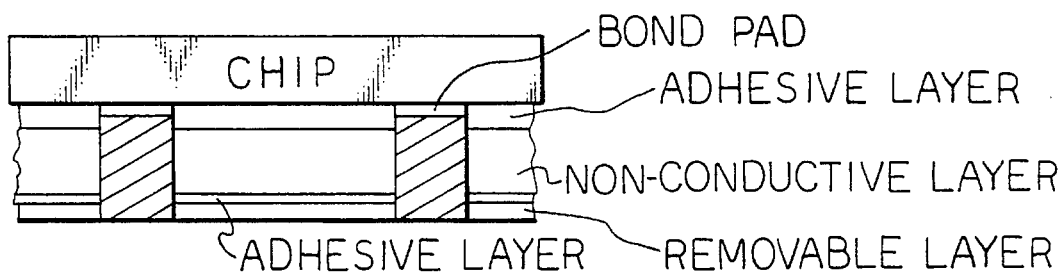
Figure 5C:
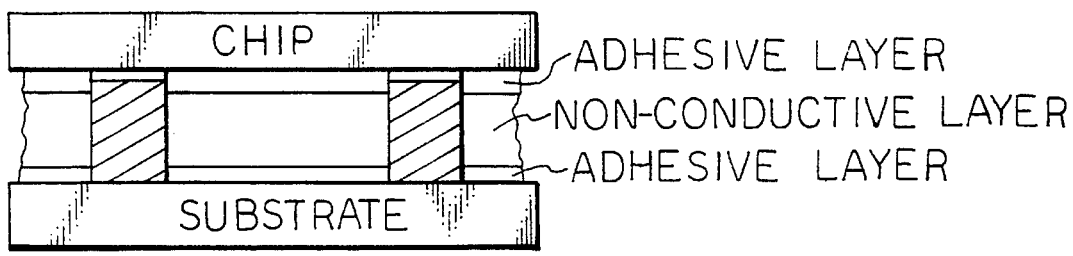

FIGS. 5(a)–5(c) depict an additional one of our improvements in Controlled Collapse Chip Connections, but instead of using adhesive balls or bumps, we employ an adhesive tape containing our conductive adhesive in the shape of columns. The tape can be seen in FIG. 5(a). It is shown adhered to the chip in FIG. 5(b), and it is then sandwiched between the chip and the substrate as can be seen in FIG. 5(c).

The adhesive used to make our conductive adhesive is a silicone pressure sensitive adhesive which comprises a resin component and a polymer component. Silicone pressure sensitive adhesives (PSAs) typically contain at least two primary components, namely a linear siloxane polymer, and a tackifier resin consisting essentially of triorganosiloxane(M) units (i.e., $R_3SiO_{1/2}$ in which R denotes a monovalent organic group) and silicate (Q) units(i.e., $SiO_{4/2}$). Such MQ resins are used to prepare silicone PSA compositions and generally have M/Q molar ratios in the range of about 0.6–0.9.

Silicone pressure sensitive adhesives are known in the art, i.e. U.S. Pat. No. 5,248,739 (Sep. 28, 1993). They include silicone pressure-sensitive adhesives containing (a) a high molecular weight polydimethylsiloxane gum (or copolymer) and (b) an MQ resin wherein the M/Q ratio is 0.5 to 1.0; and silicone PSAs comprising an MQ resin, silicone gum, and a peroxide curing agent. These compositions generally employ a resin/polymer ratio of about 40/60 to about 60/40 by weight.

Our silicone PSA composition contains:

(A) 10–60 percent by weight of a soluble organopolysiloxane resin consisting essentially of $R_3SiO_{1/2}$ siloxane units and $SiO_{4/2}$ siloxane units, wherein each R denotes a monovalent radical selected from the group consisting of hydrocarbon and halogenated hydrocarbon radicals, at least ⅓ of all R radicals being methyl, and the mole ratio of $R_3SiO_{1/2}$ siloxane units to $SiO_{4/2}$ siloxane units in the soluble organopolysiloxane resin having a value of from 0.75–1.0; and (B) 40–90 parts by weight of a polydiorganosiloxane having the general formula $R^1R^2_2SiO(R^2_2SiO)_nSiR^2_2R^1$ wherein each $R^2$ denotes a monovalent radical selected from the group consisting of hydrocarbon and halogenated hydrocarbon radicals, at least ½ of all $R^2$ radicals being methyl, each $R^1$ denotes a radical selected from the group consisting of $R^2$ radicals and OH radicals, and the subscript n is a number having an average value of at least 50.

Component (A) is a soluble organopolysiloxane resin consisting essentially of $R_3SiO_{1/2}$ siloxane units and $SiO_{4/2}$ siloxane units. By the term soluble is meant that the organopolysiloxane can be dissolved, substantially completely, in either a hydrocarbon liquid such as benzene, toluene, xylene, heptane, and the like, or in a silicone liquid such as a volatile cyclic or linear polydiorganosiloxane. Preferably the resin is soluble in component (B).

In the formula for component (A), R denotes a monovalent radical selected from the group consisting of hydrocarbon and halogenated hydrocarbon radicals, preferably having less than 20 carbon atoms, and most preferably having from 1–10 carbon atoms. Examples of suitable R radicals include alkyl radicals such as methyl, ethyl, propyl, pentyl, octyl, undecyl and octadecyl; cycloalphatic radicals, such as cyclohexyl; aryl radicals such as phenyl, tolyl, xylyl, benzyl and 2-phenylethyl; alkenyl radicals such as vinyl; and chlorinated hydrocarbon radicals such as 3-chloropropyl and dichlorophenyl.

To enhance the solubility of component (A) in component (B), it is desirable to select the predominant R radicals of the former to match the predominant $R^2$ radicals of the latter. Preferably, at least one-third, and more preferably substantially all R radical in the formula for component (A), are methyl radicals. The methyl radicals can be distributed in any desired arrangement among the $R_3SiO_{1/2}$ siloxane units; however, it is preferred that each $R_3SiO_{1/2}$ siloxane unit bear at least one, and more preferably at least two, methyl radicals. Examples of preferred $R_3SiO_{1/2}$ siloxane units include $Me_3SiO_{1/2}$, $PhMe_2SiO_{1/2}$, and $Ph_2MeSiO_{1/2}$, where Me denotes methyl and Ph denotes phenyl.

Component (A) includes a resinous portion wherein the $R_3SiO_{1/2}$ siloxane M units are bonded to the $SiO_{4/2}$ siloxane Q units, each of which is bonded to at least one other $SiO_{4/2}$ siloxane unit. Some $SiO_{4/2}$ siloxane units are bonded to hydroxyl radicals resulting in $HOSiO_{3/2}$ units (i.e., TOH units), thereby accounting for the silicon-bonded hydroxyl content of the organopolysiloxane resin, and some are bonded only to other $SiO_{4/2}$ siloxane units.

Component (B) is a polydiorganosiloxane having the general formula $R^1R^2_2SiO(R^2_2SiO)_nSiR^2_2R^1$. In this formula, each $R^2$ denotes a monovalent radical selected from the group consisting of hydrocarbon and halogenated hydrocarbon radicals, and each $R^1$ denotes a radical selected from the group consisting of $R^2$ radicals and OH radicals. Examples of $R^2$ radicals include the hydrocarbon and halogenated hydrocarbon radicals noted above for R, as well as monovalent hydrocarbon radicals which contain olefinic unsaturation, such as alkenyl and cycloalkenyl radicals, examples thereof being vinyl, allyl, butenyl, hexenyl, cyclohexenyl and beta-cyclohexenylethyl. Component (B) can be comprised of a single polydiorganosiloxane, or a mixture of two or more different polydiorganosiloxanes.

Component (B) will typically comprise a polydiorganosiloxane in which at least 50%, and preferably at least 85%, of the $R^2$ radicals are methyl radicals. The methyl radicals can be distributed in any manner in the polydiorganosiloxane. $R^1$ can be an $R^2$ radical or a hydroxyl radical. For example, both $R^1$ radicals can be $R^2$ such as methyl, vinyl, phenyl, or hydroxyl. Alternatively the $R^1$ radicals can be different, such as methyl and vinyl, or methyl and hydroxyl. In addition, component (B) can comprise trace amounts of siloxane branching sites, such as $R^2SiO_{3/2}$ units, and $SiO_{4/2}$ units, provided that the component remains flowable.

Component (B) preferably consists essentially of a polydiorganosiloxane having the general formula $R''R'_2SiO(R'_2SiO)_nSiR'_2R''$ wherein each R' denotes methyl, phenyl or alkenyl, at least 85 percent of which are methyl radicals, and each R" denotes an OH radical. The average value of the subscript n in the above formula depends on the type of PSA being prepared. For formulations which include sufficient solvent to impart a practical working viscosity to the final PSA composition, the average value of n is typically greater than about 200.

The average value of n used should preferably provide an organopolysiloxane component (B) having a viscosity at 25° C. of about 50 millipascal-seconds (50 centipoise) to about 100 kilopascal-seconds (100,000,000 centipoise), the viscosity being a function of the $R^2$ radicals on this polymer. The preferred viscosity of component (B) depends on the specific properties desired in the silicone pressure sensitive adhesive. Silicone pressure sensitive adhesives utilizing a gum based polydiorganosiloxane as component (B), have a viscosity in the range of 300,000 to 10,000,000 centipoise when measured at 25° C.

Polydiorganosiloxanes most preferred for component (B) in the conductive adhesive compositions of our invention include hydroxyl-terminated polydiorganosiloxanes, some examples of which are:

$HOMe_2SiO(Me_2SiO)_nSiMe_2OH$, $HOR^2_2SiO(Me_2SiO)_{0.94n}(Ph_2SiO)_{0.06n}SiR^2_2OH$, $HOR^2_2SiO(Me_2SiO)_{0.95n}(MeViSiO)_{0.05n}SiR^2_2OH$, and $HOR^2_2SiO(Me_2SiO)_{0.88n}(Ph_2SiO)_{0.12n}SiR^2_2OH$, wherein Me, Vi and Ph, denote methyl, vinyl and phenyl, respectively; and both $R^2$ radicals at the terminal portions are the same as those of at least one of the other siloxane units present in the polydiorganosiloxane; and n has its previously defined meaning.

The optimum relative amounts of components (A) and (B) that are used to form the conductive silicone PSA compositions of our invention can be best determined by routine experimentation, since adhesive performance is at least a function of the molecular weights of resin (A) and polymer (B). Typically, however, 10–60 percent by weight of component (A) is used with 40–90 percent by weight of component (B). These amounts are non-volatile amounts.

Although these PSAs can be cured by heating to temperatures of up to about 300° C. for a suitable length of time, it is preferred that a catalyst (C) be included, to obtain superior adhesive properties. Catalyst (C) can be any reactive material that is effective to convert component (B) from its normally flowable state to a non-flowable state. Preferred are organic peroxides such as benzoyl peroxide; dicumyl peroxide $[C_6H_5C(CH_3)_2O]_2$; 2,5-dimethyl-2,5-di-(t-butylperoxy) hexane; and 2,4-dichlorobenzoyl peroxide (DCBP). Benzoyl peroxide is a particularly effective organic peroxide catalytic agent. The organic peroxide catalyst is used in an amount of about 0.5–3.0 percent by weight based on the weight of components (A) and (B).

Curing of the adhesive compositions is accomplished by heating at temperatures up to 300° C., preferably 80°–200° C., for a suitable length of time, typically 2–30 minutes. The compositions may also be cured by ultraviolet light or electron beam radiation.

The compositions are made by homogeneously mixing 10–60 percent by weight of component (A), and 40–90 percent by weight of component (B), in the presence of a non-reactive solvent. Solvents useful in our invention include hydrocarbons such as toluene, xylene, heptane, and mineral spirits; volatile siloxanes such as octamethylcyclotetrasiloxane and hexamethyldisiloxane; halohydrocarbons; alcohols; esters; ketones; and combinations of these solvents. The amount of solvent depends on the viscosity of the polydiorganosiloxane component (B). Higher viscosity polydiorganosiloxane polymers require more solvent than lower viscosity polydiorganosiloxane polymers, to facilitate preparation, handling and applying, of the compositions.

Suitable mixing means that can be used in their preparation include a spatula, a drum roller, a mechanical stirrer, a three-roll mill, a sigma blade mixer, a bread-dough mixer, and a two-roll mill. Preferably, the peroxide catalyst (C) is added to the above mixture just before the product is to be used.

These pressure sensitive adhesives remain flexible and will readily stick to a substrate whether it is flexible or rigid, thus minimizing stress on the chip which may arise from any differences in the coefficient of thermal expansion between the chip and the substrate. They may be applied by any suitable means such as rolling or spreading and cured as described above.

Another important aspect of these adhesives is that they were surprisingly found to provide complete protection to aluminum bond pads during prolonged exposure to salt-fog. An additional aspect of these adhesives is that no other mechanical means is required to maintain the electrical connection.

The substrate may be any solid material including metals such as aluminum, silver, copper, iron, and their alloys; organic polymeric materials including polyolefins such as polyethylene, and polypropylene; fluorocarbon polymers such as polytetrafluoroethylene, and polyvinylfluoride; silicone elastomers; silicone resins; polystyrene; polyamides such as Nylon; polyester and acrylic polymers; siliceous materials such as glass; and ceramic materials such as alumina, zirconia, aluminum nitride, and beryllia.

Tacky conductive adhesives most suitable according to our invention should contain 10–60 percent by weight of the silicone resin, and 40–90 percent by weight of the siloxane gum. The peroxide catalyst is present in an amount of about 0.5–3.0 percent by weight based on the weight of the silicone resin and the siloxane gum.

When fibers are used as the conductive particulate material to make our tacky adhesive conductive, the conductive fibers are used in an amount corresponding to about 60–70 percent by weight, based on the weight of the silicone resin and the siloxane gum.

When microspheres or spherical metallic particles are used as the conductive particulate material to make our tacky adhesive conductive, the conductive microspheres or spherical metallic particles are used in an amount corresponding to about 2–45 percent by weight, based on the weight of the silicone resin and the siloxane gum.

Generally, any solvent present can be removed from the adhesive mixture by heating the mixture at 66°–93° C. for about one minute. The mixture can then be cured by heating it at 177°–204° C. for about two minutes when benzoyl peroxide is used as catalyst; or by heating it at 132° C. for two minutes when the catalyst is 2,4-dichlorobenzoyl peroxide (DCBP).

In the examples below, the silicone resin component of our adhesive was a siloxane resin copolymer consisting essentially of $(CH_3)_3SiO_2$ units and $SiO_{4/2}$ units, in a molar ratio of approximately 0.75–1.0, and containing 2.4–2.9 weight percent hydroxyl, based on solids as determined by Fourier Transform Infrared Spectroscopy (FTIR), according to ASTM E-168. The silicone polymer component was a hydroxyl terminated polydimethylsiloxane gum having a plasticity number of 54–61 mils based on ASTM D926. It is a high molecular weight siloxane gum conforming generally to the formula $HOMe_2SiO(Me_2SiO)_nSiMe_2OH$, where n has a value of about 10,000.

The following example illustrates our first embodiment of tacky conductive adhesive which includes the silicone resin, siloxane gum, silver-clad glass fibers as the conductive particulate material, and peroxide catalyst. This particular system can be described as a Reversible Die Bonding Test Process.

EXAMPLE I

In this example, our tacky conductive adhesive was prepared by combining (a) 1,061 grams of a mixture of 30% of the silicone resin and 20% of the siloxane gum in xylene, the mixture containing 0.5 grams of solids; (b) 1,666 grams of a solution of the siloxane gum in toluene, the solution containing 0.5 grams of solids; (c) 0.01 grams of benzoyl peroxide; (d) 0.19 grams of toluene; and (e) 1,857 grams of silver-clad glass fibers. The silver-clad glass fibers had a size distribution of 10–125 μm, a mean diameter of 35 μm, and a dry bulk resistivity of 0.003 ohm-centimeters. The overall final solids composition of this tacky conductive adhesive was 35 weight percent silicone resin and siloxane gum (25.85 percent resin and 74.15 percent gum), and 65 weight percent of silver-clad glass fibers. We found that if the concentration of the silver-clad glass fibers was 70 weight percent or higher, the system lost its tacky character. We also determined that conductivity appeared to drop when the concentration of the silver-clad glass fibers was less than about 60 weight percent. The cured tacky material was prepared by first dissolving benzoyl peroxide in toluene in an aluminum dish. The silicone resin and the siloxane gum solutions were then added. The resulting solution was stirred to disperse the peroxide catalyst. Next, the silver-clad glass fibers were added, and the mixture was stirred about 10 minutes to obtain a uniform solution. The tacky conductive material was heated at 37° C. for about 3 hours until all solvent had been removed. The material was cured by heating at about 150° C. for 30 minutes. A volume resistivity of 0.058 ohm-centimeters was obtained for this particular formulation. The tacky conductive adhesive material of this example had good cohesive strength, and possessed excellent adhesion to the aluminum dish in which it was cured.

The following examples represent our second embodiment of tacky conductive adhesive prepared from the silicone resin, the siloxane gum, spherical microspheres or metallic particles as the conductive particulate material, and peroxide catalyst.

EXAMPLE II

In this example, our tacky conductive adhesive was prepared by combining (a) 1.868 grams of a mixture containing 30% of the silicone resin and 20% of the siloxane gum in xylene, the mixture containing 1.0 grams of solids; (b) 0.01 grams of benzoyl peroxide; (c) 0.19 grams of toluene; and (d) 0.733 grams of silver-coated hollow glass microspheres having an average diameter of about 3 μm. We made the conductive adhesive by first dissolving benzoyl peroxide curing catalyst in toluene. The solution of silicone resin and siloxane gum, and the benzoyl peroxide solution were then mixed together. This required about 2–5 minutes of mixing time. The silver-coated hollow glass microspheres were added to the solution of adhesive and catalyst. This addition required about 10 minutes of mixing time. After obtaining a uniformly mixed material, it was heated for 2 hours and 25 minutes at 35° C. to remove the solvent. After all solvent was removed, the material was cured at 150° C. for 30 minutes. Electrical tests on this very tacky adhesive showed that it was not conductive within itself. However, when it was pressed between two 1" by 3" aluminum coated glass slides, adhesion and conductivity was obtained.

EXAMPLE III

In this example, we prepared a uniform solution by combining (a) 1,868 grams of a mixture containing the silicone resin and the siloxane gum in xylene, the mixture containing 1.0 grams of solids; (b) 0.01 grams of benzoyl peroxide; and (c) 0.19 grams of toluene. These materials were mixed for 5–10 minutes. This uniform solution was used in the examples below, to prepare two more tacky conductive adhesives, which are further illustrative of our invention. The adhesives prepared in Examples IV and V were applied and electrically tested in the same manner as in Example II, and with similar results.

EXAMPLE IV

In this example, we combined (a) 0.1019 grams of the solution prepared in Example III, and (b) 0.06065 grams of particles of a 39Sn/10Cu alloy (99.9% pure) with an average diameter of 10 mils (254 micrometers). These materials were mixed for 5–10 minutes, dried at 35° C. for 2 hours, and cured at 150° C. for 30 minutes. This conductive material had excellent adhesion to the substrate. When pressed between two conductive substrates, the composition was conductive.

EXAMPLE V

In this example, we combined (a) 0.35326 grams of the solution prepared in Example III, and (b) 0.25593 grams of particles of a 49Pb/5Sn alloy (99.9% pure) with an average diameter of 16 mils (406 micrometers). These materials were mixed for 5–10 minutes, dried at 35° C. for 2 hours, and cured at 150° C. for 30 minutes. This conductive material had excellent adhesion to the substrate. When pressed between two conductive substrates, the composition was conductive.

EXAMPLE VI

The purpose of this example was to determine if a salt-fog would corrode the bond pads of a device coated with our conductive adhesive. In order to make this determination, we coated an aluminum metalized wafer with the conductive adhesive prepared in Example I. The coating was applied to the wafer by a shim tape draw-down method, and the resulting coating had a thickness of about 380 microns. The coated aluminum metalized wafer was subjected to salt-fog exposure according to the test protocol prescribed by the American. Society for Testing and Materials ASTM B-117, using a 0.5% solution of NaCl as the salt-fog. The salt-fog had a pH of 7.0. After salt-fog exposure for 72 hours as prescribed in the ASTM protocol, the conductive adhesive coating was scraped away from the bond pads, and no corrosion was present.

These tacky conductive adhesives can be used in various applications, including the several embodiments shown in the drawings.

With respect to the embodiment in FIGS. 5(a)–5(c) in particular, our new tacky conductive adhesive can be formed into columns, instead of balls or bumps, as depicted in FIG. 5(a). In this embodiment, it is applied between the flip chip and substrate as a tape, which includes several superimposed layers of materials. Thus, removable layers form top and bottom surfaces of the tape. These removable layers can be made of a sheet or film-like material such as paper, polyethylene, polypropylene, polytetrafluoroethylene, poly(vinyl chloride), or polyester. Where paper is used as the removable layer, it is typically treated or coated with polypropylene or a silicone oil, in order to provide release from the adhesive portions of the tape.

Below the removable layers are two adhesive layers for providing adhesion of the tape to the surfaces of the flip chip and substrate. These adhesive layers can be made of the tacky adhesive of our invention, i.e. the silicone resin and siloxane gum, but without the conductive particles. In addition, other conventional pressure sensitive adhesives (PSAs) made from natural or synthetic materials can be used, such as natural rubber-based PSAs; styrene-butadiene rubber-based PSAs; polyisobutylene-based PSAs; acrylic-based PSAs; or vinyl acetate copolymer-based PSAs.

As the non-conductive layer in FIG. 5(a), there can be employed any suitable insulating material, such as an epoxy resin, silicone resin, silicone elastomer or silicone rubber, polytetrafluoroethylene, or polyethylene terephthalate, for example.

According to this embodiment of our invention, the tape in FIG. 5(a) is sandwiched between the flip chip and the substrate as depicted in FIGS. 5(b) and 5(c), with the conductive adhesive columns aligned so as to make contact with the bond pads of the flip chip and the corresponding interconnects of the substrate.

Conductive silicone pressure sensitive adhesives according to our invention are compatible with, and can be used in conjunction with, first-level packages categorized as fully hermetic, quasi-hermetic, or plastic encapsulated.

Other variations may be made in the compounds, compositions, and methods described without departing from the essential features of the invention. The forms of invention are exemplary and not limitations on its scope as defined in the claims.

We claim:

1. A method of joining a chip to a substrate comprising positioning a flip chip back-side-up with respect to a substrate, wherein an electrical connection can be made between the circuits on the flip chip and the substrate, applying an adhesive between the active side of the flip chip and the substrate, the adhesive being an electrically conductive silicone pressure sensitive adhesive containing (i) a silicone resin, (ii) a siloxane gum, (iii) a conductive particulate material, and optionally (iv) a peroxide catalyst, and joining the flip chip and the substrate with the conductive silicone pressure sensitive adhesive therebetween.

2. A method according to claim 1 in which the conductive particulate material is selected from the group consisting of silver-clad glass fibers; spherical gold particles; spherical hollow glass microspheres coated with silver, gold, nickel, or copper; and spherical particles of metal alloys of Sn/Cu, Pb/Sn, or Au/Sn.

3. A method according to claim 1 in which the adhesive is heated after it is applied between the active side of the flip chip and the substrate.

4. A method according to claim 1 in which the adhesive is applied as a ball or bump between a bond pad on the active side of the flip chip and an interconnect on the substrate.

5. A method according to claim 1 in which the active side of the flip chip contains a solder ball or bump, the adhesive is applied by containing it in a socket element located on the substrate, and the active side of the flip chip with the solder ball or bump and the substrate are pressed together, sinking the solder ball or bump into the adhesive in the socket element on the substrate.

6. A method according to claim 1 in which the adhesive is in the form of a tape, the tape being sandwiched between the active side of the flip chip and the substrate, the tape including at least one column of conductive adhesive, the column being aligned with a bond pad on the active side of the flip chip and an interconnect on the substrate.

7. A method according to claim 1 in which the flip chip is removed from the substrate and attached to a final circuit substrate after it has been electrically tested.

8. A method according to claim 1 in which the adhesive is applied so as to cover exposed metals which are part of the interconnect system.

* * * * *